US007495505B2

(12) United States Patent
Chang et al.

(10) Patent No.: US 7,495,505 B2

(45) Date of Patent: Feb. 24, 2009

(54) LOW SUPPLY VOLTAGE BAND-GAP REFERENCE CIRCUIT AND NEGATIVE TEMPERATURE COEFFICIENT CURRENT GENERATION UNIT THEREOF AND METHOD FOR SUPPLYING BAND-GAP REFERENCE CURRENT

(75) Inventors: Kuen-Shan Chang, Hsinchu (TW); Uei-Shan Uang, Shalu Township, Taichung County (TW); Mei-Show Chen, Hsinchu (TW); Chia-Ming Hong, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 83 days.

(21) Appl. No.: 11/489,096

(22) Filed: Jul. 18, 2006

(65) Prior Publication Data

US 2008/0018319 A1 Jan. 24, 2008

(51) Int. Cl.

| | |
|---|---|
| ***G05F 1/10*** | (2006.01) |
| ***G05F 3/02*** | (2006.01) |
| ***G05F 3/04*** | (2006.01) |
| ***G05F 3/16*** | (2006.01) |
| ***H01L 35/00*** | (2006.01) |
| ***H01L 37/00*** | (2006.01) |

(52) U.S. Cl. ....................... 327/539; 327/538; 327/513; 327/540; 327/541; 327/512; 323/313; 323/315; 323/316

(58) Field of Classification Search ................. 327/538, 327/513, 539–541, 512; 323/313, 315, 316

See application file for complete search history.

(56) References Cited

U.S. PATENT DOCUMENTS

| | | | | |
|---|---|---|---|---|
| 6,052,020 | A | 4/2000 | Doyle | 327/539 |
| 6,232,829 | B1 * | 5/2001 | Dow | 327/539 |
| 6,489,831 | B1 * | 12/2002 | Matranga et al. | 327/512 |
| 6,563,371 | B2 * | 5/2003 | Buckley et al. | 327/539 |
| 6,667,892 | B1 | 12/2003 | Lin et al. | 363/49 |
| 6,737,908 | B2 * | 5/2004 | Mottola et al. | 327/539 |
| 6,891,358 | B2 * | 5/2005 | Marinca | 323/316 |
| 6,906,581 | B2 * | 6/2005 | Kang et al. | 327/539 |
| 7,199,646 | B1 * | 4/2007 | Zupcau et al. | 327/539 |
| 7,301,321 | B1 * | 11/2007 | Uang et al. | 323/313 |
| 7,411,380 | B2 * | 8/2008 | Chang et al. | 323/314 |
| 2003/0006747 | A1 * | 1/2003 | Jaussi et al. | 323/315 |

* cited by examiner

*Primary Examiner*—Akm E Ullah
*Assistant Examiner*—Jue Zhang
(74) *Attorney, Agent, or Firm*—J.C. Patents

(57) ABSTRACT

A low supply voltage band-gap reference circuit is provided, which includes a positive temperature coefficient current generation unit and a negative temperature coefficient current generation unit, and it is implemented by way of current summing. Through the current-mode temperature compensation technique, the present invention is able to reduce the voltage headroom and the number of operational amplifiers required by the conventional voltage-summing method, as well as the influence to the output voltage due to the offset voltage, thereby providing a stable and low voltage band-gap reference voltage level. In addition, by reducing the number of operational amplifiers and resistors of high resistance, the circuit area is reduced, and chip cost is saved.

27 Claims, 7 Drawing Sheets

LOW SUPPLY VOLTAGE BAND-GAP REFERENCE CIRCUIT AND NEGATIVE TEMPERATURE COEFFICIENT CURRENT GENERATION UNIT THEREOF AND METHOD FOR SUPPLYING BAND-GAP REFERENCE CURRENT

BACKGROUND OF THE INVENTION

1. Field of Invention

The present invention relates to a band-gap reference circuit, and more particularly, to a low supply voltage band-gap reference circuit.

2. Description of Related Art

Generally, in many ultra-large integrated circuit (IC) systems, basic and essential semiconductor band-gap circuits are built-in. Responsible for generating source reference current (or voltage), the band-gap circuit determines the accuracy of the whole system.

FIG. 1A is a circuit diagram of a conventional band-gap reference circuit. FIG. 1B shows a relationship diagram between the output voltage and temperature of the conventional band-gap reference circuit shown in FIG. 1A. Referring to both FIG. 1A and FIG. 1B, if the currents passing through diodes D1 and D2 are both I, the proportion between element areas of the diodes D1 and D2 is 1:n, and the resistance R1=R3, the output voltage of the operational amplifier $$
\begin{aligned}
110\ V_{BG} &= V_{BE1} + \frac{R_1}{R_2}(V_{BE1} - V_{BE2}) \\
&= V_{BE1} + \frac{R_1}{R_2}(\Delta V_{BE}) \\
&= V_{BE1} + \frac{R_1}{R_2}(V_T \cdot \ln(n)) \\
&= V_{BE1} + K \cdot V_T \\
&\approx 1.205\text{ V.}
\end{aligned}
$$

Through properly adjusting the resistance ratio between R1 and R2 and the proportion between the element areas of the diodes D1 and D2 (i.e., determining the proportion n of the current density between the two diodes D1 and D2), the output voltage $V_{BG}$ maintains a constant value without being influenced by the temperature.

At present, considering the case of low voltage and low power, many systems of supply voltage lower than 1.2 V generally require a low supply voltage band-gap reference circuit. The conventional band-gap reference circuit shown in FIG. 1A cannot generate a low band-gap voltage for low-voltage systems. To meet the requirements of low voltage and low power, U.S. Pat. No. 6,052,020 discloses a band-gap reference circuit for generating a low output voltage through the voltage average technique. Referring to FIG. 2A, the band-gap reference circuit can generate a low band-gap voltage lower than 1.205V. FIG. 2B is a relationship diagram between the output voltage and temperature of the conventional band-gap reference circuit shown in FIG. 2A. Referring to both FIGS. 2A and 2B, the band-gap reference circuit utilizes the conventional positive temperature coefficient current generation unit 210 to provide the internal negative temperature coefficient voltage $V_{BE}$ and the positive temperature coefficient voltage $K \cdot V_T$. Next, the voltages $V_{BE}$ and $K \cdot V_T$ are averaged by the voltage averaging circuit 220, and the band-gap voltage $V_{BG}$ lower than 1V is output. The conventional band-gap reference circuit generates the desired output voltage level by adjusting the proportion between the resistances R1 and R2.

Since more than three operational amplifiers and resistors R1, R2, R3A, and R3B of high resistance are required in the conventional art, the complexity of the band-gap reference circuit in FIG. 2A is significantly increased. Particularly, the operational amplifiers actually have different offset voltages $V_{OS}$, therefore the more operational amplifiers are used, the more offset voltages $V_{OS}$ are generated to influence the accuracy of the band-gap reference circuit. In addition, considering the low statistic current, the resistances of resistors R3A and R3B must be set to be relatively high (e.g., 96 KΩ). The resistors R1, R2, R3A, and R3B with higher resistance require relatively large areas, thus increasing the chip area and chip cost.

SUMMARY OF THE INVENTION

An object of the present invention is to provide a low supply voltage band-gap reference circuit, used for generating a band-gap voltage under a low supply voltage, so as to reduce the circuit area and cost.

Another object of the present invention is to provide a negative temperature coefficient current generation unit, used for generating a negative temperature coefficient current while reducing the circuit area and cost.

Still another object of the present invention is to provide a method for supplying a band-gap reference current, so as to generate a stable and low voltage band-gap reference current.

Based upon the above and other objects, the present invention provides a low supply voltage band-gap reference circuit, which comprises a positive temperature coefficient current generation unit and a negative temperature coefficient current generation unit. The positive temperature coefficient current generation unit generates a positive coefficient current according to a first internal voltage and a second internal voltage. The negative temperature coefficient current generation unit includes a voltage-to-current converter and a current mirror. According to the first internal voltage of the positive temperature coefficient current generation unit, the voltage-to-current converter generates a corresponding first current. A master current end of the current mirror is coupled to the voltage-to-current converter to receive the first current, and duplicates the first current according to a predetermined proportion, so as to provide a negative coefficient current at the slave current end of the current mirror. The sum of the positive coefficient current and the negative coefficient current is the output of the band-gap reference circuit.

The present invention provides a method for supplying a band-gap reference current, which comprises generating a positive coefficient current with a positive temperature coefficient; generating a negative coefficient current with a negative temperature coefficient; and adding the positive coefficient current and negative coefficient current. The step of generating the positive coefficient current includes generating a first internal voltage with a negative temperature coefficient; generating a second internal voltage with a negative temperature coefficient; and generating a positive coefficient current according to the first internal voltage and the second internal voltage. The step of forming the negative coefficient current includes converting the first internal voltage into a first current with a negative temperature coefficient; duplicating the first current according to a predetermined proportion, so as to generate a negative coefficient current.

The present invention discloses a low supply voltage band-gap reference circuit, which comprises a positive temperature coefficient current generation unit and a negative temperature coefficient current generation unit, and it is implemented by way of current summing. With the current-mode temperature compensation technique, the present invention reduces the voltage headroom and the number of the operational amplifiers required by the conventional voltage summing method, and reduces the influence to the output voltage due to the offset voltage, thereby generating a low voltage and stable band-gap reference voltage level. In addition, the number of the operational amplifiers and the resistors of high resistance are reduced, thus reducing the circuit area and saving chip cost.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 3A:
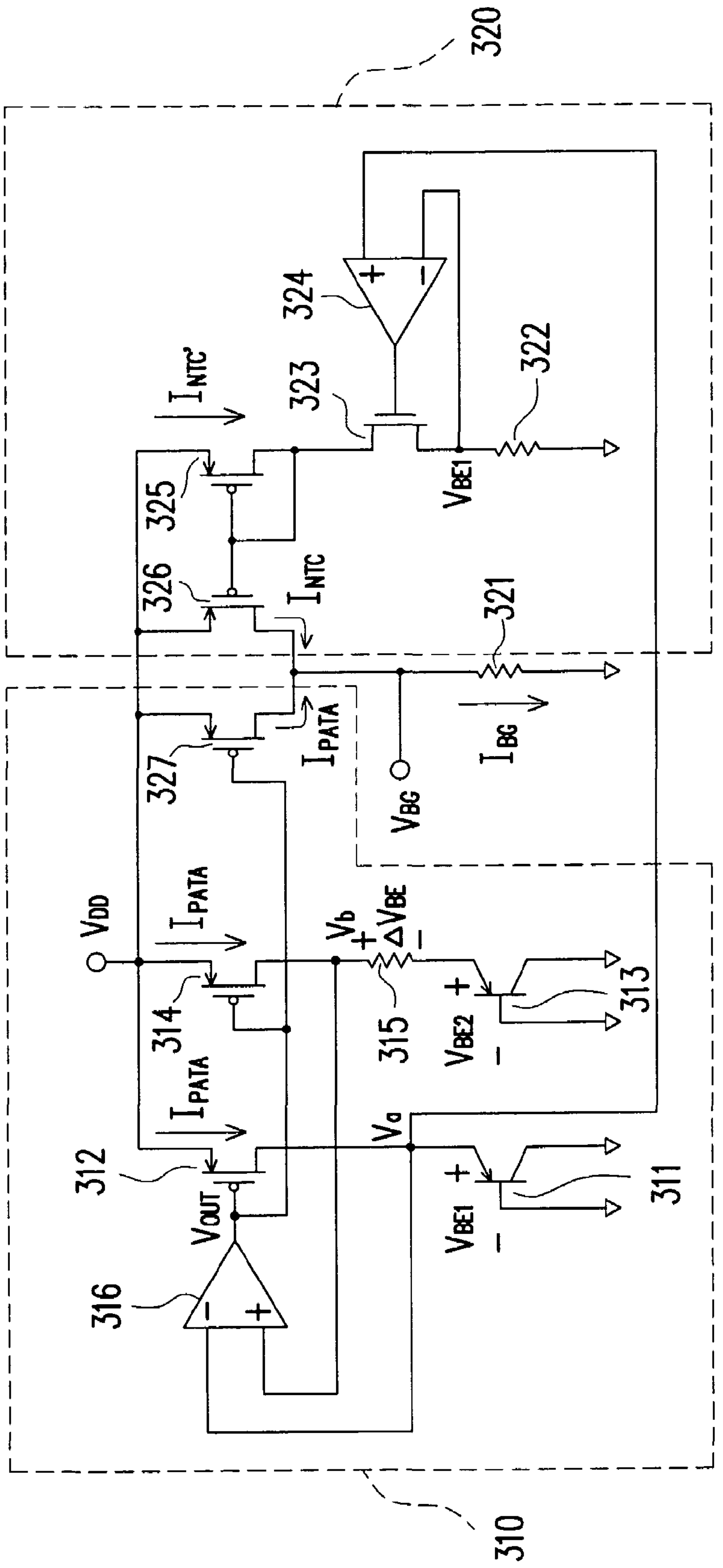
FIG. 3A shows an embodiment of a low supply voltage band-gap reference circuit according to the present invention.

In many ultra-large integrated circuits, a band-gap reference circuit is generally built-in for generating the source reference voltage. Currently, considering the case of low voltage and low power, the band-gap reference circuit requires a low band-gap voltage with a voltage lower than 1.205 V. FIG. 3A shows an embodiment of a low supply voltage band-gap reference circuit according to the present invention. Referring to FIG. 3A, this band-gap reference circuit comprises a positive temperature coefficient current generation unit 310 and a negative temperature coefficient current generation unit 320. In the positive temperature coefficient current generation unit 310, a first operational amplifier 316 outputs a voltage Vout for adjusting the P-type transistors 312 and 314, such that Va=Vb, thereby generating a positive coefficient current $I_{PTAT}$ with a positive temperature coefficient according to the voltage across the resistor 315. The negative temperature coefficient current generation unit 320 converts the first internal voltage Va into a negative coefficient current $I_{NTC}$ with a negative temperature coefficient. The sum of the positive coefficient current $I_{PTAT}$ and the negative coefficient current $I_{NTC}$ is the output of the band-gap reference circuit $I_{BG}$. In this embodiment, a resistor 321 is further utilized to convert the band-gap current $I_{BG}$ into the band-gap current $V_{BG}$.

In this embodiment, the positive temperature coefficient current generation unit 310 comprises a first transistor 327, a fourth transistor 311, a fifth transistor 312, a sixth transistor 313, a seventh transistor 314, a second resistor 315, and a first operational amplifier 316. Herein, the transistors 311 and 313 are implemented with PNP-type BJTs, and the transistors 312 and 314 are implemented with P-type MOSFETs. The bases and collectors of the transistors 311 and 313 are coupled to a first constant voltage (e.g., ground voltage). The transistor 311 has an emitter coupled to the drain of the transistor 312 and provides the first internal voltage Va. A first end of the resistor 315 is coupled to the emitter of the transistor 313 and provides a third internal voltage, and a second end of the resistor 315 is coupled to the drain of the transistor 314 and provides a second internal voltage Vb. The sources of the transistors 312 and 314 are coupled to a second constant voltage (e.g., system voltage) $V_{DD}$. A first input end (e.g., negative input end) and a second input end (e.g., positive input end) of the operational amplifier 316 are respectively coupled to the drains of the transistors 312 and 314, and output the bias voltage $V_{OUT}$ according to the first internal voltage Va and the second internal voltage Vb. The first transistor 327 is a P-type transistor in this embodiment. A gate of the transistor 327 receives the bias voltage $V_{OUT}$ output by the operational amplifier 316, a source thereof is coupled to the second constant voltage $V_{DD}$, and a drain thereof outputs the positive coefficient current $I_{PTAT}$.

The negative temperature coefficient current generation unit 320 comprises a voltage-to-current converter and a current mirror. In this embodiment, the voltage-to-current converter including a third resistor 322, an eighth transistor 323 and a second operational amplifier 324 generates a corresponding first current $I_{NTC}'$ according to the first internal voltage Va or Vb of the positive temperature coefficient current generation unit 310. The resistor 322 and the transistor 323 are connected in series between the master current end of the current mirror and the ground voltage. A first input end (e.g., positive input end) of the operational amplifier 324 is coupled to the emitter of the fourth transistor 311. A second input end (e.g., negative input end) of the operational amplifier 324 is coupled to the source of the eighth transistor 323. An output end of the operational amplifier 324 is coupled to the gate of the transistor 323. In this embodiment, the eighth transistor 323 is an N-type MOSFET. In addition, a designer can optionally change the operational amplifier 324 to be coupled to the resistor 315 for receiving the second internal voltage Vb, such that the voltage-to-current converter generates a corresponding first current $I_{NTC}'$ according to the second internal voltage Vb. The variation of the above embodiment also falls into the scope of the present invention.

The master current end of the above current mirror is coupled to the voltage-to-current converter for receiving the first current $I_{NTC}'$, and duplicating the first current $I_{NTC}'$ according to a predetermined proportion, so as to provide a negative coefficient current $I_{NTC}$ at the slave current end of the current mirror. The current mirror includes a second transistor 325 and a third transistor 326. The drains of the transistors 325 and 326 are respectively the master current end and slave current end of the current mirror. The sources of the transistors 325 and 326 are coupled to a second constant voltage $V_{DD}$. The drain of the transistor 325 is further coupled to the gates of the transistors 325 and 326. In this embodiment, the second transistor 325 and the third transistor 326 are P-type MOSFETs. Furthermore, the above-mentioned predetermined proportion is 1:1, that is, the first current $I_{NTC}'$ is equal to the negative coefficient current $I_{NTC}$.

In this embodiment, a first end of the first resistor 321 is coupled to the current mirror and the positive temperature coefficient current generation unit 310 for receiving the negative coefficient current $I_{NTC}$ and the positive coefficient current $I_{PTAT}$, and a second end of the first resistor 321 is coupled to the first constant voltage (e.g., ground voltage). The sum current $I_{BG}$ of the current $I_{NTC}$ and the current $I_{PTAT}$ is converted into the low band-gap voltage $V_{BG}$ through the resistor 321. If the resistances of resistors 315, 321 and 322 are $R_{315}$, $R_{321}$ and $R_{322}$ respectively, $$\begin{aligned}\text{the band-gap voltage } V_{BG} &= R_{321}\cdot I_{BG}\\ &= R_{321}\cdot(I_{NTC}+I_{PTAT})\\ &= R_{321}\cdot\left(\frac{V_{BE1}}{R_{322}}+\frac{\Delta V_{BE1}}{R_{315}}\right)\\ &= \frac{R_{321}}{R_{322}}\cdot\left(V_{BE1}+\frac{R_{322}}{R_{315}}\cdot V_T\cdot\ln(n)\right).\end{aligned}$$

It is assumed that the current $I_{PTAT}$=6.75 uA, $R_{315}$=8 KΩ, and $R_{321}$=58.2 KΩ. Under a room temperature, $V_{BE1}$ is about 733 mV. The resistance of the resistor 322 is selected to be 100 KΩ, such that the current $$I_{NTC}=\frac{V_{BE1}}{R_{322}}=7\ \mu\text{A}.$$

Figure 1A:
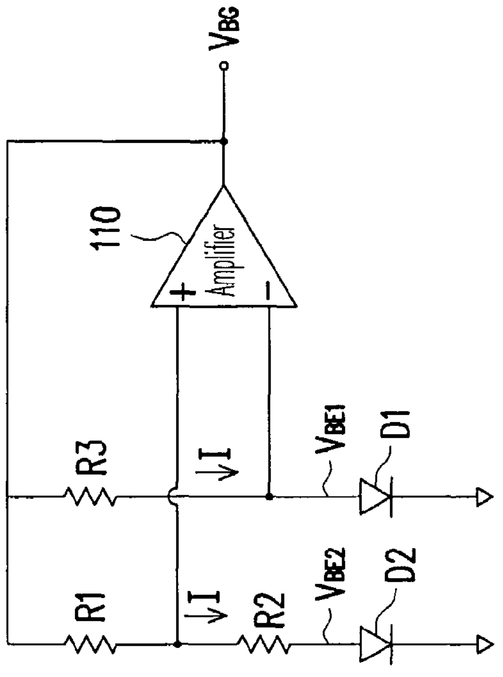
FIG. 1A(PRIOR ART)
FIG. 1A is a circuit diagram of a conventional band-gap reference circuit.
Figure 1B:
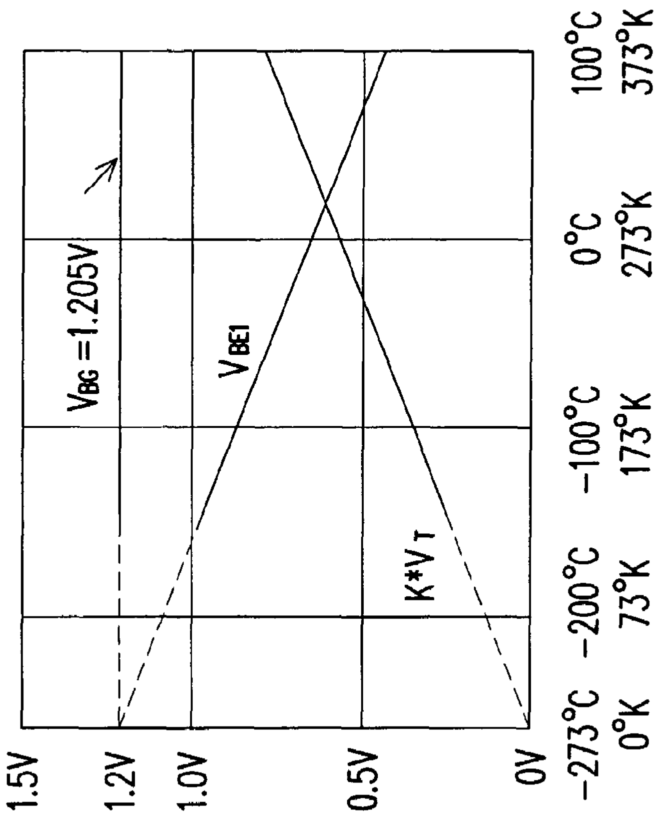
FIG. 1B(PRIOR ART)
FIG. 1B shows a relationship diagram between the output voltage and temperature of the conventional band-gap reference circuit shown in FIG. 1A.
Figure 2A:
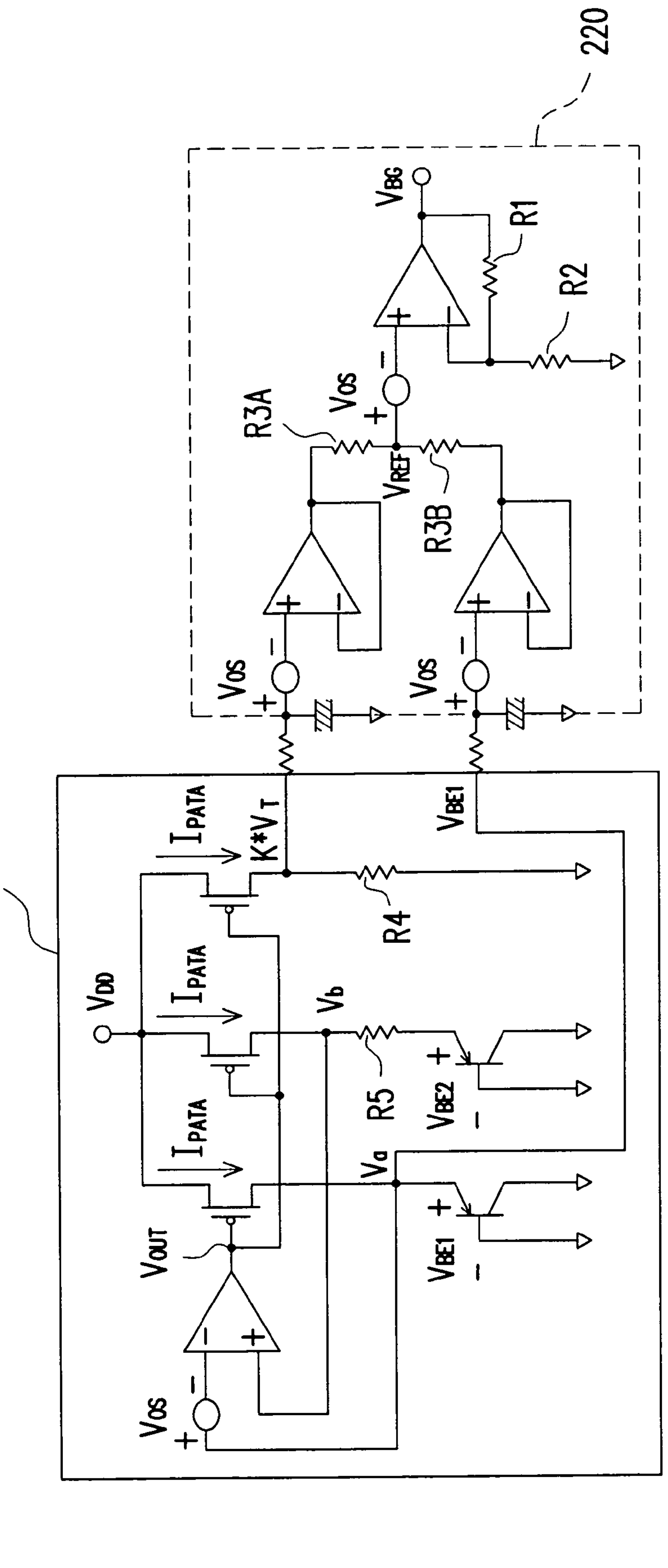
FIG. 2A(PRIOR ART)
FIG. 2A shows a band-gap reference circuit disclosed in U.S. Pat. No. 6,052,020.
Figure 2B:
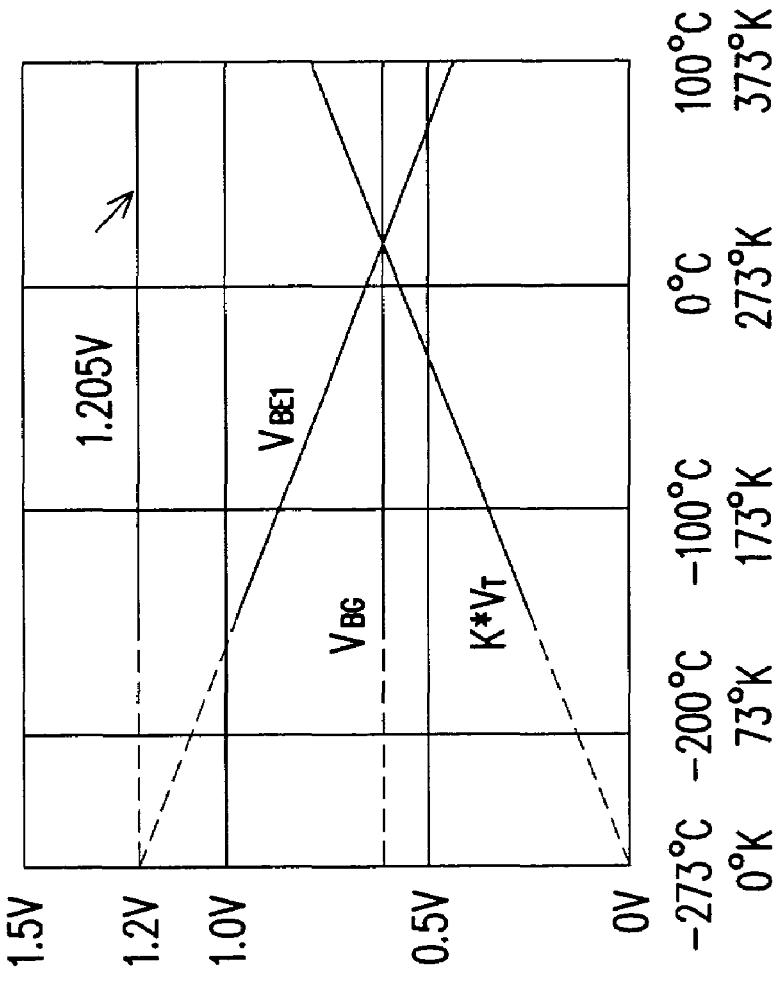
FIG. 2B(PRIOR ART)
FIG. 2B is a relationship diagram between the output voltage and temperature of the conventional band-gap reference circuit shown in FIG. 2A.
Figure 3B:
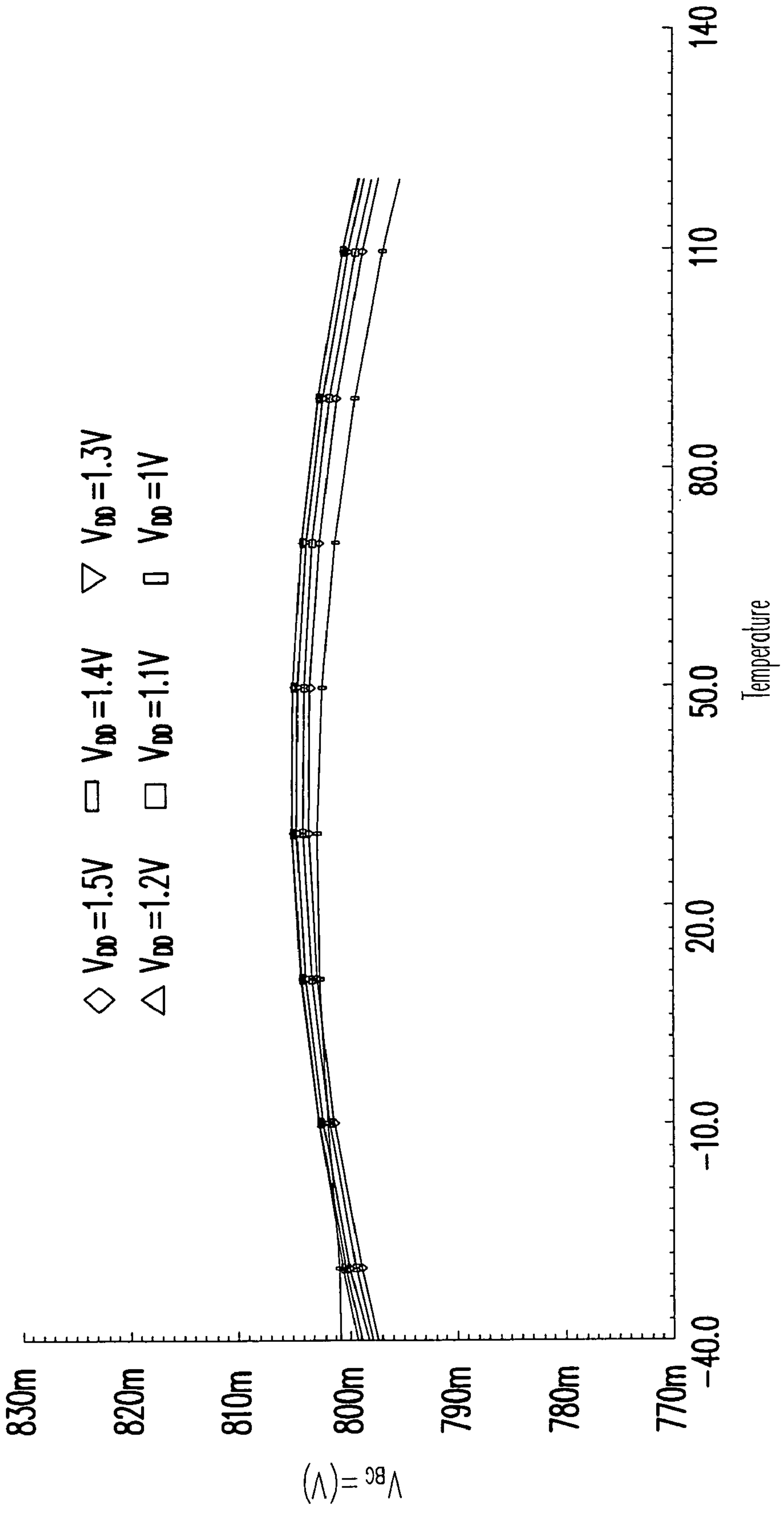
FIG. 3B is a characteristic curve of the band-gap voltage $V_{BG}$ and the temperature in FIG. 3A.

Finally, the band-gap voltage $V_{BG}=R_{321}\cdot(I_{NTC}+I_{PTAT})$=58.2 KΩ·(7 uA+6.75 uA)=0.80025V. Therefore, this embodiment may be used to generate a stable low band-gap voltage. In this embodiment, the desired level of the band-gap voltage $V_{BG}$ can be easily adjusted by adjusting the resistance $R_{321}$ of the resistor 321. Compared with the conventional art, the resistance proportion between the resistors R1, R2 with higher resistance in FIG. 2A is not required to be adjusted in this embodiment, thus the desired level of the band-gap voltage $V_{BG}$ can be adjusted easily and accurately. FIG. 3B is a characteristic curve of the band-gap voltage $V_{BG}$ and the temperature in FIG. 3A.

The lowest supply voltage required by the band-gap reference circuit is about 1.0V. However, the voltage-to-current converter is limited by the physical characteristics of the BJT (especially under the temperature of −40° C., $V_{BE}$=0.83V). To eliminate this phenomenon, a simple resistor network may be added to the band-gap reference circuit by those skilled in the art, so as to voltage-divide the level of $V_{BE}$.

Figure 4:
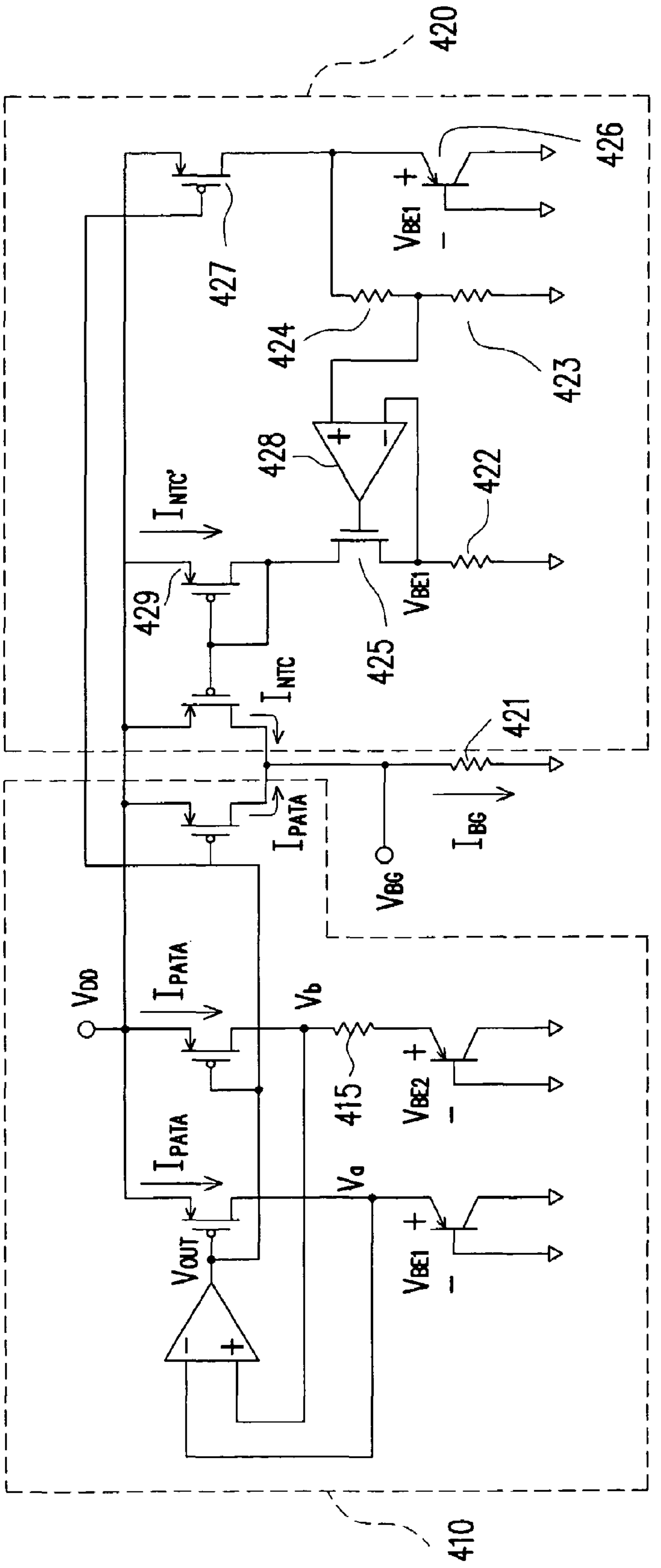
FIG. 4 shows another embodiment of the low supply voltage band-gap reference circuit according to the present invention.

FIG. 4 shows another embodiment of the low supply voltage band-gap reference circuit according to the present invention. Referring to FIG. 4, the band-gap reference circuit comprises a positive temperature coefficient current generation unit 410 and a negative temperature coefficient current generation unit 420. The negative temperature coefficient current generation unit 420 includes a voltage-to-current converter and a current mirror. The positive temperature coefficient current generation unit 410, the current mirror of the negative temperature coefficient current generation unit 420, and the first resistor 421 are the same as the positive temperature coefficient current generation unit 310, the current mirror, and the first resistor 321 in FIG. 3, and thus will not be described herein any more.

The voltage-to-current converter in FIG. 4 includes a fourth resistor 422, a fifth resistor 423, a sixth resistor 424, a ninth transistor 425, a tenth transistor 426, an eleventh transistor 427, and a third operational amplifier 428. In this embodiment, the ninth transistor 425 is an N-type MOSFET, the tenth transistor 426 is a PNP-type BJT, and the eleventh transistor 427 is a P-type MOSFET. The first end of the resistor 422 is coupled to a first constant voltage (ground voltage herein), and the second end of the resistor 422 is coupled to the source of the transistor 425. The drain of the transistor 425 is coupled to the master current end of the current mirror (i.e., drain of transistor 429). The first end of the resistor 423 is grounded. The resistor 424 is coupled between the second end of the resistor 423 and the emitter of the transistor 426. The base and collector of the transistor 426 are both grounded. The drain of the transistor 427 is coupled to the emitter of the transistor 426. The source of the transistor 427 is coupled to a second constant voltage (system voltage herein) $V_{DD}$. The gate of the transistor 427 receives the bias voltage $V_{OUT}$. The first input end (positive input end herein) of the operational amplifier 428 is coupled to the second end of the resistor 423, the second input end (negative input end herein) is coupled to the source of the transistor 425, and the output end is coupled to the gate of the transistor 425.

The $V_{BE}$ is voltage-divided by the fifth resistor 423 and the sixth resistor 424, such that the voltage across the resistor 422 is not excessively high (e.g., lower than $V_{BE}$=0.83V under the temperature of −40° C.). Thus, the band-gap reference circuit of this embodiment may be operated under the circumstance in which the supply voltage is close to 1.0V.

Figure 5:
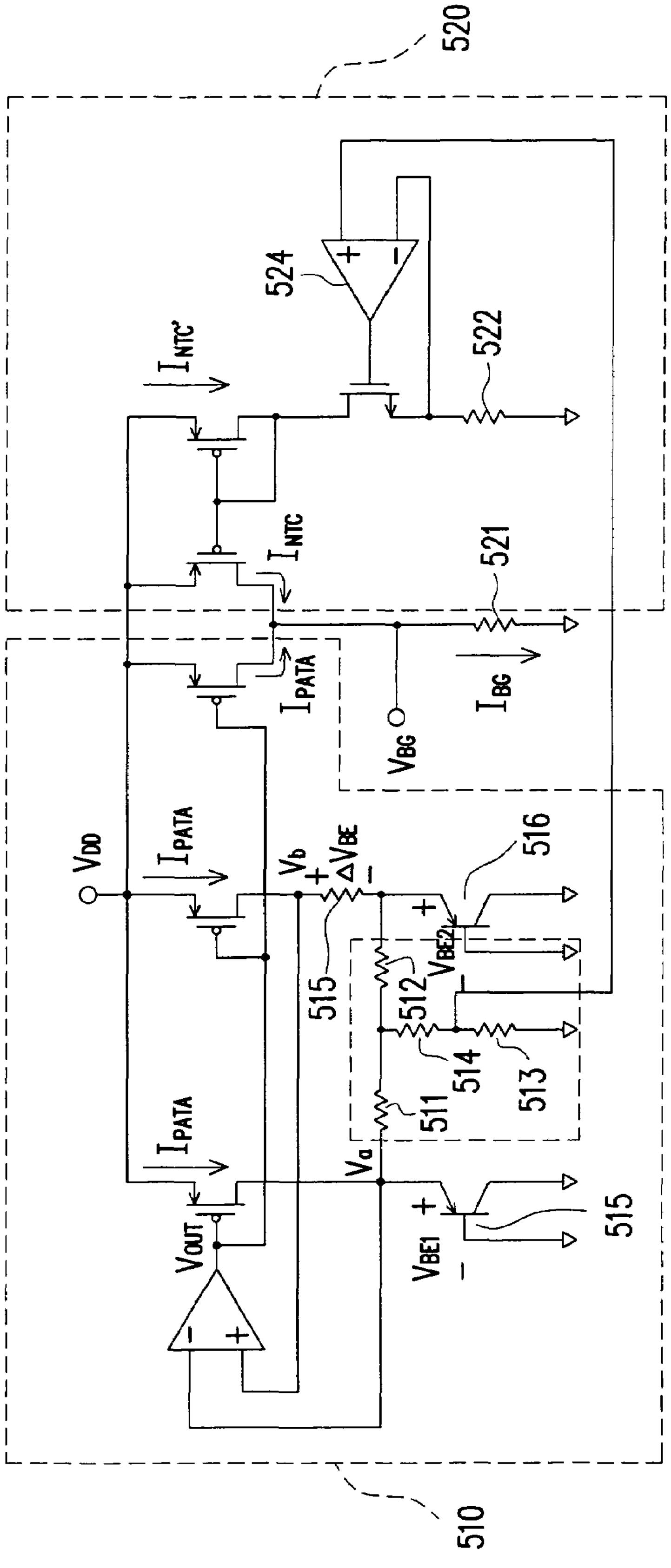
FIG. 5 shows still another embodiment of the low supply voltage band-gap reference circuit according to the present invention.

To enable the band-gap reference circuit to be operated with the supply voltage close to 1.0 V, the present invention is also implemented with reference to FIG. 5. FIG. 5 shows still another embodiment of the low supply voltage band-gap reference circuit according to the present invention. Referring to FIG. 5, the band-gap reference circuit comprises a positive temperature coefficient current generation unit 510 and a negative temperature coefficient current generation unit 520. The band-gap reference circuit of FIG. 5 is similar to that of FIG. 3A, thus the same part between them will not be descried therein any more. Compared with FIG. 3A, the positive temperature coefficient current generation unit 510 of FIG. 5 further includes a seventh resistor 511, an eighth resistor 512, a ninth resistor 513 and a tenth resistor 514. The resistors 511 and 512 are connected in series between the emitters of the transistors 515 and 516. A first end of the resistor 513 is coupled to a first constant voltage (i.e., ground voltage), and a second end is coupled to the first end of the resistor 514. A second end of the resistor 514 is coupled to the second end of the resistor 511. Being different from FIG. 3A in which the positive input end of the operational amplifier 324 is used to receive the voltage $V_{BE1}$, in this embodiment, a resistor network (including resistors 511-514) is first utilized to voltage-divide the $V_{BE}$ and then being provided to the positive input end of the operational amplifier 524. Therefore, the band-gap reference circuit of this embodiment is operated with the supply voltage lower than 1.0V. The above resistors 511, 512, 513 and 514 may be optionally changed by the designers to be disposed into the negative temperature coefficient current generation unit 520.

Table 1 is a comparison table of the conventional circuit in FIG. 2A and the circuits in FIG. 3A, FIG. 4 and FIG. 5 according to the embodiments of the present invention. As seen from Table 1, the number of resistors and operational amplifiers required in the embodiments of the present invention is lower than that required in the conventional circuit in FIG. 2A. Due to the reduced number of the operational amplifiers, the influence to the accuracy of the band-gap reference circuit caused by the offset voltage $V_{OS}$ is relieved. In addition, it also can be seen from Table 1 that the total resistance required in the embodiments of the present invention is less than that required in the conventional circuit of FIG. 2A. For example, compared with the conventional circuit of FIG. 2A, up to 422 KΩ is saved in the embodiment of FIG. 3A (i.e., about 79.2% of the chip area and chip cost are saved).

TABLE 1

| | resistance (Ω) | Reduced Area (%) | Number of operational amplifiers | method |
|---|---|---|---|---|
| FIG. 2A | R1 = 78 KΩ<br>R2 = 240 KΩ<br>R3A = 96 KΩ<br>R3B = 96 KΩ<br>R4 = 70.4 KΩ<br>R5 = 8 KΩ | — | 4 | voltage summing |
| FIG. 3A | $R_{322}$ = 100 KΩ<br>$R_{321}$ = 58.2 KΩ<br>$R_{315}$ = 8 KΩ | 79.2% (Compared to FIG. 2A) | 2 | current summing |
| FIG. 4 | $R_{423}$ + $R_{424}$ = 200 KΩ<br>$R_{422}$ = 21 KΩ<br>$R_{421}$ = 29.8 KΩ<br>$R_{415}$ = 8 KΩ | 56.8% (Compared to FIG. 2A) | 2 | current summing |
| FIG. 5 | $R_{511}$ + $R_{512}$ = 200 KΩ<br>$R_{513}$ + $R_{514}$ = 200 KΩ<br>$R_{522}$ = 20 KΩ<br>$R_{521}$ = 35.5 KΩ<br>$R_{515}$ = 8 KΩ | 21.2% (Compared to FIG. 2A) | 2 | current summing |

To sum up, through the current-mode combining technique, a stable low band-gap voltage is generated in the present invention, and the number of operational amplifiers is reduced, and thereby reducing the influence to the accuracy of the band-gap voltage caused by the offset voltage. In addition, by reducing the number of operational amplifiers and resistors with a high resistance, the circuit area and the chip cost are reduced. Therefore, the band-gap reference circuit can be operated with the supply voltage close to 1.0V. Therefore, the present invention can be applied in any low voltage CMOS manufacturing process (e.g., 0.25 um, 0.18 um, and 0.13 um).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low supply voltage band-gap reference circuit, comprising:

a positive temperature coefficient current generation unit, for generating a positive coefficient current according to a first internal voltage and a second internal voltage, the positive temperature coefficient current generation unit comprising:

a first operational amplifier, having a positive input end and a negative input end for respectively receiving the second internal voltage and the first internal voltage and outputting a bias voltage; and a fourth transistor, having a base and a first emitter/collector coupled to a first constant voltage, and a second emitter/collector for providing the first internal voltage; and a negative temperature coefficient current generation unit, comprising:

a voltage-to-current converter, for generating a corresponding first current according to the first internal voltage of the positive temperature coefficient current generation unit, the voltage-to-current converter comprising:

an eighth transistor, having a first source/drain, a second source/drain, and a gate; and a second operational amplifier, having a positive input end coupled to the second emitter/collector of the fourth transistor, a negative input end coupled to the first source/drain of the eighth transistor, and an output end coupled to the gate of the eighth transistor; and a current mirror, having a master current end coupled to the voltage-to-current converter, for receiving the first current, duplicating the first current according to a predetermined proportion, and providing a negative coefficient current at a slave current end of the current mirror, wherein the sum of the positive coefficient current and the negative coefficient current is the output of the band-gap reference circuit.

2. The low supply voltage band-gap reference circuit as claimed in claim 1, further comprising:

a first resistor, having a first end coupled to the current mirror and the positive temperature coefficient current generation unit for receiving the positive coefficient current and the negative coefficient current, and a second end grounded.

3. The low supply voltage band-gap reference circuit as claimed in claim 1, wherein the current mirror comprises:

a second transistor, having a first source/drain being a master current end of the current mirror, a second source/drain coupled to a second constant voltage, and a gate coupled to the first source/drain of the second transistor; and a third transistor, having a first source/drain being a slave current end of the current mirror, a second source/drain coupled to the second constant voltage, and a gate coupled to the gate of the second transistor.

4. The low supply voltage band-gap reference circuit as claimed in claim 3, wherein the second transistor and the third transistor are P-type metal-oxide-semiconductor field effect transistors (MOSFET).

5. The low supply voltage band-gap reference circuit as claimed in claim 1, wherein the positive temperature coefficient current generation unit further comprises:

a first transistor, having a gate coupled to the output end of the first operational amplifier for receiving the bias voltage, a first source/drain coupled to a second constant voltage, and a second source/drain for outputting the positive coefficient current;

a fifth transistor, having a first source/drain coupled to the second emitter/collector of the fourth transistor, a second source/drain coupled to the second constant voltage, and a gate for receiving the bias voltage;

a sixth transistor, having a base and a first emitter/collector coupled to the first constant voltage;

a second resistor, having a first end coupled to the second emitter/collector of the sixth transistor, and a second end for providing the second internal voltage; and a seventh transistor, having a first source/drain coupled to the second end of the second resistor, a second source/drain coupled to the second constant voltage, and a gate for receiving the bias voltage.

6. The low supply voltage band-gap reference circuit as claimed in claim 5, wherein the first constant voltage is a ground voltage, and the second constant voltage is a system voltage.

7. The low supply voltage band-gap reference circuit as claimed in claim 5, wherein the first transistor is a P-type transistor.

8. The low supply voltage band-gap reference circuit as claimed in claim 5, wherein the sixth transistor is a PNP-type or a NPN-type bipolar junction transistor (BJT).

9. The low supply voltage band-gap reference circuit as claimed in claim 5, wherein the fifth transistor and the seventh transistor are P-type MOSFETs.

10. The low supply voltage band-gap reference circuit as claimed in claim 1, wherein the voltage-to-current converter comprises:

a third resistor, having a first end coupled to the first constant voltage, wherein the first source/drain of the eighth transistor is coupled to a second end of the third resistor, and the second source/drain of the eighth transistor is coupled to the master current end of the current mirror.

11. The low supply voltage band-gap reference circuit as claimed in claim 1, wherein the eighth transistor is an N-type MOSFET.

12. The low supply voltage band-gap reference circuit as claimed in claim 5, wherein the voltage-to-current converter comprises:

a fourth resistor, having a first end coupled to the first constant voltage;

a fifth resistor, having a first end coupled to the first constant voltage;

a sixth resistor, having a first end coupled to a second end of the fifth resistor;

a ninth transistor, having a first source/drain coupled to a second end of the fourth resistor, and a second source/drain coupled to the master current end of the current mirror;

a tenth transistor, having a base and a first emitter/collector both coupled to the first constant voltage, and a second emitter/collector coupled to a second end of the sixth resistor;

an eleventh transistor, having a first source/drain coupled to the second emitter/collector of the tenth transistor, a second source/drain coupled to the second constant voltage, and a gate for receiving the bias voltage; and a third operational amplifier, having a first input end coupled to the second end of the fifth resistor, a second input end coupled to the first source/drain of the ninth transistor, and an output end coupled to a gate of the ninth transistor.

13. The low supply voltage band-gap reference circuit as claimed in claim 12, wherein the ninth transistor is an N-type MOSFET, the tenth transistor is a PNP-type BJT, and the eleventh transistor is a P-type MOSFET.

14. The low supply voltage band-gap reference circuit as claimed in claim 5, wherein the positive temperature coefficient current generation unit further comprises:

a seventh resistor, having a first end coupled to the second emitter/collector of the fourth transistor;

an eighth resistor, having a first end coupled to the second end of the seventh resistor, and a second end coupled to the second emitter/collector of the sixth transistor;

a ninth resistor, having a first end coupled to the first constant voltage; and a tenth resistor, having a first end coupled to a second end of the ninth resistor, and a second end coupled to a second end of the seventh resistor.

15. A low supply voltage band-gap reference circuit as claimed in claim 14, wherein the voltage-to-current converter comprises:

an eleventh resistor, having a first end coupled to the first constant voltage;

a twelfth transistor, having a first source/drain coupled to a second end of the eleventh resistor, and a second source/drain coupled to the master current end of the current mirror; and a fourth operational amplifier, having a first input end coupled to the second end of the ninth resistor, a second input end coupled to the first source/drain of the twelfth transistor, and an output end coupled to a gate of the twelfth transistor.

16. The low supply voltage band-gap reference circuit as claimed in claim 15, wherein the twelfth transistor is an N-type MOSFET.

17. A negative temperature coefficient current generation unit, for generating a negative coefficient current according to a first internal voltage, wherein the first internal voltage is provided from a positive temperature coefficient current generation unit, the positive temperature coefficient current generation unit generates a positive coefficient current according to the first internal voltage and a second internal voltage, the positive temperature coefficient current generation unit has a first operational amplifier and a fourth transistor, the first operational amplifier has a positive input end and a negative input end for respectively receiving the second internal voltage and the first internal voltage and outputting a bias voltage, the fourth transistor has a base and a first emitter/collector coupled to a first constant voltage, and a second emitter/collector for providing the first internal voltage, and the negative temperature coefficient current generation unit comprises:

a voltage-to-current converter, for generating a corresponding first current according to the first internal voltage in the positive temperature coefficient current generation unit, the voltage-to-current converter comprising:

an eighth transistor, having a first source/drain, a second source/drain, and a gate;

a second operational amplifier, having a positive input end for receiving the first internal voltage of the positive temperature coefficient current generation unit, a negative input end coupled to the first source/drain of the eighth transistor, and an output end coupled to the gate of the eighth transistor; and a current mirror, having a master current end coupled to the voltage-to-current converter for receiving the first current, duplicating the first current according to a predetermined proportion, and providing the negative coefficient current at a slave current end of the current mirror.

18. The negative temperature coefficient current generation unit as claimed in claim 17, wherein the current mirror comprises:

a second transistor, having a first source/drain being the master current end of the current mirror, a second source/drain coupled to a second constant voltage, and a gate coupled to the first source/drain of the second transistor; and a third transistor, having a first source/drain being the slave current end of the current mirror, a second source/drain coupled to the second constant voltage, and a gate coupled to the gate of the second transistor.

19. The negative temperature coefficient current generation unit as claimed in claim 18, wherein the second transistor and the third transistor are P-type MOSFETs.

20. The negative temperature coefficient current generation unit as claimed in claim 17, wherein the voltage-to-current converter comprises:

a third resistor, having a first end coupled to a first constant voltage, wherein the first source/drain of the eighth transistor is coupled to a second end of the third resistor, and a second source/drain of the eighth transistor is coupled to the master current end of the current mirror.

21. The negative temperature coefficient current generation unit as claimed in claim 17, wherein the eighth transistor is an N-type MOSFET.

22. The negative temperature coefficient current generation unit as claimed in claim 17, wherein the positive temperature coefficient current generation unit further generates a bias voltage according to the first internal voltage and the second internal voltage, and the voltage-to-current converter comprises:

a fourth resistor, having a first end coupled to a first constant voltage;

a fifth resistor, having a first end coupled to the first constant voltage;

a sixth resistor, having a first end coupled to a second end of the fifth resistor;

a ninth transistor, having a first source/drain coupled to a second end of the fourth resistor, and a second source/drain coupled to the master current end of the current mirror;

a tenth transistor, having a base and a first emitter/collector coupled to the first constant voltage, and a second emitter/collector coupled to a second end of the sixth resistor;

an eleventh transistor, having a first source/drain coupled to a second emitter/collector of the tenth transistor, a second source/drain coupled to the second constant voltage, and a gate for receiving the bias voltage; and a third operational amplifier, having a first input end coupled to the second end of the fifth resistor, a second input end coupled to the first source/drain of the ninth transistor, and an output end coupled to a gate of the ninth transistor.

23. The negative temperature coefficient current generation unit as claimed in claim 22, wherein the first constant voltage is a ground voltage, and the second constant voltage is a system voltage.

24. The negative temperature coefficient current generation unit as claimed in claim 22, wherein the ninth transistor is an N-type MOSFET, the tenth transistor is a PNP-type BJT, and the eleventh transistor is a P-type MOSFET.

25. The negative temperature coefficient current generation unit as claimed in claim 17, wherein the positive temperature coefficient current generation unit further has a third internal voltage, and the voltage-to-current converter comprises:

a seventh resistor, having a first end for receiving the first internal voltage of the positive temperature coefficient current generation unit;

an eighth resistor, having a first end coupled to a second end of the seventh resistor, a second end for receiving the third internal voltage of the positive temperature coefficient current generation unit;

a ninth resistor, having a first end coupled to a first constant voltage;

a tenth resistor, having a first end coupled to a second end of the ninth resistor, and a second end coupled to a second end of the seventh resistor;

an eleventh resistor, having a first end coupled to the first constant voltage;

a twelfth transistor, having a first source/drain coupled to a second end of the eleventh resistor, and a second source/drain coupled to the master current end of the current mirror; and a fourth operational amplifier, having a first input end coupled to a second end of the ninth resistor, a second input end coupled to the first source/drain of the twelfth transistor, and an output end o coupled to a gate of the twelfth transistor.

26. The negative temperature coefficient current generation unit as claimed in claim 25, wherein the twelfth transistor is an N-type MOSFET.

27. The low supply voltage band-gap reference circuit as claimed in claim 1, wherein the fourth transistor is a PNP-type or NPN-Type bipolar junction transistor (BJT).

* * * * *